(12) United States Patent
Kobayakawa

(10) Patent No.: US 6,580,161 B2
(45) Date of Patent: Jun. 17, 2003

(54) SEMICONDUCTOR DEVICE AND METHOD OF MAKING THE SAME

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/057,732

(22) Filed: Jan. 23, 2002

(65) Prior Publication Data
US 2002/0096756 A1 Jul. 25, 2002

(30) Foreign Application Priority Data
Jan. 25, 2001 (JP) ........................................ 2001-017226

(51) Int. Cl.[7] ............................................. H01L 23/495
(52) U.S. Cl. ........................ 257/676; 257/787; 438/124; 438/123
(58) Field of Search ................................. 257/787, 666, 257/676, 692; 438/111, 123, 124, 127

(56) References Cited
U.S. PATENT DOCUMENTS 5,834,837 A * 11/1998 Song
5,977,613 A * 11/1999 Takata et al.
6,198,171 B1 * 3/2001 Huang et al.
6,437,429 B1 * 8/2002 Su et al.

* cited by examiner

Primary Examiner—Sheila V. Clark
(74) Attorney, Agent, or Firm—Merchant & Gould P.C.

(57) ABSTRACT

A semiconductor device includes a plurality of conductors 2A each of which includes a first surface 20a, a second surface 20b opposite to the first surface, a thickness defined between these surfaces, and a thin-walled end portion 22a retreating from the first surface 20a toward the second surface 20b and having a side surface 24 connected to the second surface 20b. The device also includes a semiconductor chip 1 having a plurality of electrodes 10a, 10b electrically connected to the plurality of conductors 2A, respectively, and a resin package 3 for sealing the conductors 2A and the semiconductor chip 1 while exposing, for each conductor 2A, the side surface 24 of the thin-walled end portion 22a and at least apart of the second surface 20b connected to the side surface 24.

3 Claims, 14 Drawing Sheets

US 6,580,161 B2

SEMICONDUCTOR DEVICE AND METHOD OF MAKING THE SAME

TECHNICAL FIELD

The present invention relates to a resin-packaged surface-mounting semiconductor device and a method of making the same.

BACKGROUND OF THE INVENTION

FIGS. 14A–14C are sectional views illustrating the process steps of a prior art method for making a semiconductor device Y1. First, as shown in FIG. 14A, a semiconductor chip 8 is mounted on a conductor frame 9, and electrodes 80a, 80b respectively provided on the upper and the lower surfaces of the semiconductor chip 8 are electrically connected to a pair of lead portions 90 of the conductor frame 9 via a wire or a conductive adhesive. The conductor frame 9, which is generally called a lead frame, may be formed by punching or etching a metal plate of copper for example. The conductor frame 9 is formed with thin-walled etched portions 92a, 92b at each of the lead portions 90. The etched portions 92a, 92b are provided by etching the lead portions 90 from the lower surfaces 91a to a predetermined depth to form recesses 93a, 93b.

Subsequently, as shown in FIG. 14B, a resin package 81 for sealing the semiconductor chip 8 and the wire W is formed. At this time, the resin package 81 is formed so that the lower surface 91a of each lead portion 90 is partially exposed at the bottom surface 81a of the resin package 81 and the thin-walled etched portions 92b project outward from the side surfaces 81b of the resin package 81. Then, each of the lead portions 90 is cut at the position indicated by a reference sign n1 in FIG. 14B.

The semiconductor device Y1 as shown in FIG. 14C is obtained by the above-described process steps. In the semiconductor device Y1, conductors 90A, each of which has formed a part of each lead portion 90, are partially exposed at the bottom surface 81a of the resin package 81, thereby providing terminals 94 for surface-mounting. Thus, the semiconductor device Y1 can be surface-mounted to a predetermined position by reflow soldering.

In the above-described method, each lead portion 90 is cut at the thin-walled etched portion 92b. Therefore, the cutting operation can be performed more properly and easily than in the case where the lead portion 90 is cut at a thick-walled portion. Moreover, the etched portion 92a is also provided at the lower surface 91a of each lead portion 90. Therefore, in the semiconductor device Y1 finally obtained, the upper surface 91b of each conductor 90A has an area sufficient for connecting the semiconductor chip 8 or bonding of the wire W whereas each terminal 94 has a predetermined configuration and an area which is smaller than that of the upper surface 91b.

The prior art semiconductor device Y1 still has room for improvement. For example, as shown in FIG. 14C, when the semiconductor device Y1 is mounted to a mother board 95 for making a certain equipment or apparatus, a test is carried out for checking whether the solder bonding between the terminals 94 of the semiconductor device Y1 and terminals 95a of the mother board 95 has been properly performed. To perform the test relatively easily, the state of solder H used for the mounting can be visually checked with naked eyes or using an image capturing means such as a camera.

However, in the prior art semiconductor device Y1, each terminal 94 is located inward from the outer edge of the bottom surface 81a of the resin package 81. Therefore, the solder H applied between the terminals 94 and the terminals 95a exists only between the terminals in the mounting step by reflow soldering, and it is difficult to visually check the solder H from the outside. In the semiconductor device Y1, an end surface 96 of each conductor 90A is exposed at the side surface 81b of the resin package 81. However, the end surface 96 is separated from the bottom surface 1a of the resin package 81 by a predetermined height h. Therefore, in the mounting step by reflow soldering, it is unlikely that part of the solder H interposed between the terminals 94 and 95a rises up to the end surface 96 to provide a solder fillet. In this way, in the prior art semiconductor device Y1, a test for solder bonding cannot be conveniently carried out because the existence or state of the solder H cannot be visually checked.

FIG. 15 is a sectional view showing another prior art semiconductor device Y2. In the semiconductor device Y2, each conductor 90A includes a terminal 94 which reaches the outer edge of the bottom surface 81a of the resin package 81. Thus, the conductor 90A has an end surface 96 which is exposed at the side surface 81b of the resin package 81 as connected to the terminal 94. With this structure, when the terminal 94 is bonded to a terminal 95a of a mother board 95 by reflow soldering for example, part of the solder H can rise up to the end surface 96 to form a solder fillet Hf existing outside of the resin package 81. The presence of the solder fillet Hf facilitates the test for solder bonding. Specifically, it is possible to visually check, from the outside, whether the solder bonding is properly performed.

However, in the semiconductor device Y2, the portion of a conductor frame to be cut for providing each conductor 90A is not subjected to etching, thereby having a thickness t which is larger than that in the semiconductor device Y1. Therefore, the cutting operation is not easy, which may cause improper cutting of the conductor frame.

The present invention is conceived under the circumstances described above. An object of the present invention is to provide a semiconductor device which can be easily manufactured and which makes it possible to easily check the appropriateness of the surface-mounting when the semiconductor device Y2 is surface-mounted to a predetermined position via solder and, to provide a method for making such a semiconductor device.

DISCLOSURE OF THE INVENTION

According to a first aspect of the present invention, a semiconductor device is provided. The semiconductor device comprises: a plurality of conductors each of which includes a first surface, a second surface opposite to the first surface, and a thickness defined between the surfaces, and a thin-walled end portion retreating from the first surface toward the second surface and having a side surface connected to the second surface; a semiconductor chip having a plurality of electrodes electrically connected to the plurality of conductors, respectively; and a resin package for sealing the conductors and the semiconductor chip while exposing, for each conductor, the side surface of the thin-walled end portion and at least a part of the second surface connected to the side surface.

Preferably, at least one of the conductors is formed with an additional thin-walled end portion retreating from the second surface toward the first surface and surrounded by the resin package.

According to a second aspect of the present invention, a method of making a semiconductor device is provided. The method includes the steps of: mounting a semiconductor chip including a plurality of electrodes onto a conductor frame including a plurality of lead portions, each of the lead portions including a first surface, a second surface opposite to the first surface, and a thickness defined between the surfaces, and a thin-walled portion retreating from the first surface toward the second surface; electrically connecting the plurality of electrodes to the plurality of lead portions, respectively; forming a resin package for sealing the lead portions and the semiconductor chip while exposing the second surface of each lead portion so that the thin-walled portion projects outward; and cutting the thin-walled portion projecting from the resin package outside the resin package.

Preferably, in the resin sealing step, the resin package is formed so that the thin-walled portion of each lead portion extends from inside to outside the resin package.

Preferably, at least one of the lead portions is formed with an additional thin-walled end portion retreating from the second surface toward the first surface and surrounded by the resin package.

Preferably, the thin-walled portion is formed by etching the first surface of the lead portion.

BEST MODE FOR CARRYING OUT THE INVENTION

Figure 1:
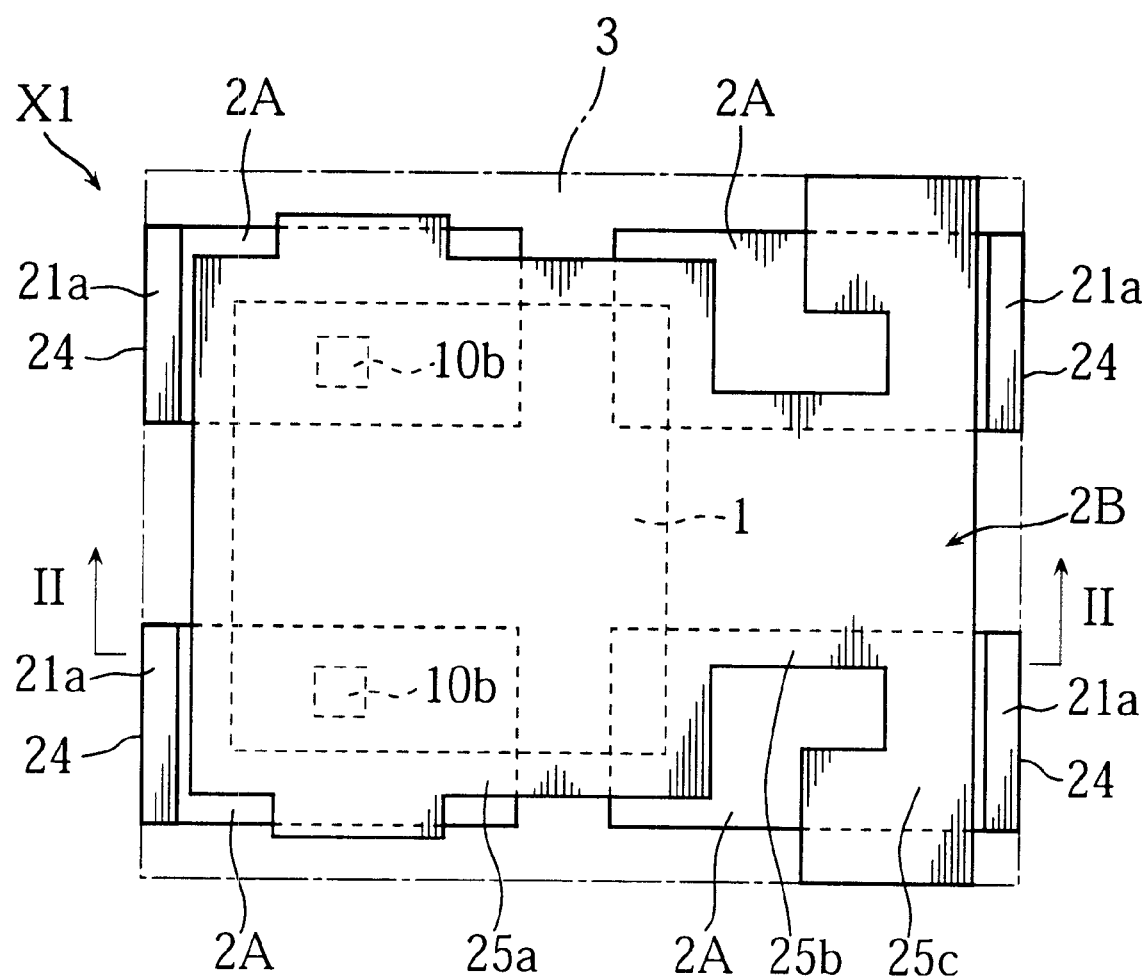
FIG. 1 is a plan view showing a semiconductor device according to a first embodiment of the present invention in which the resin package is illustrated as transparent.
Figure 2:
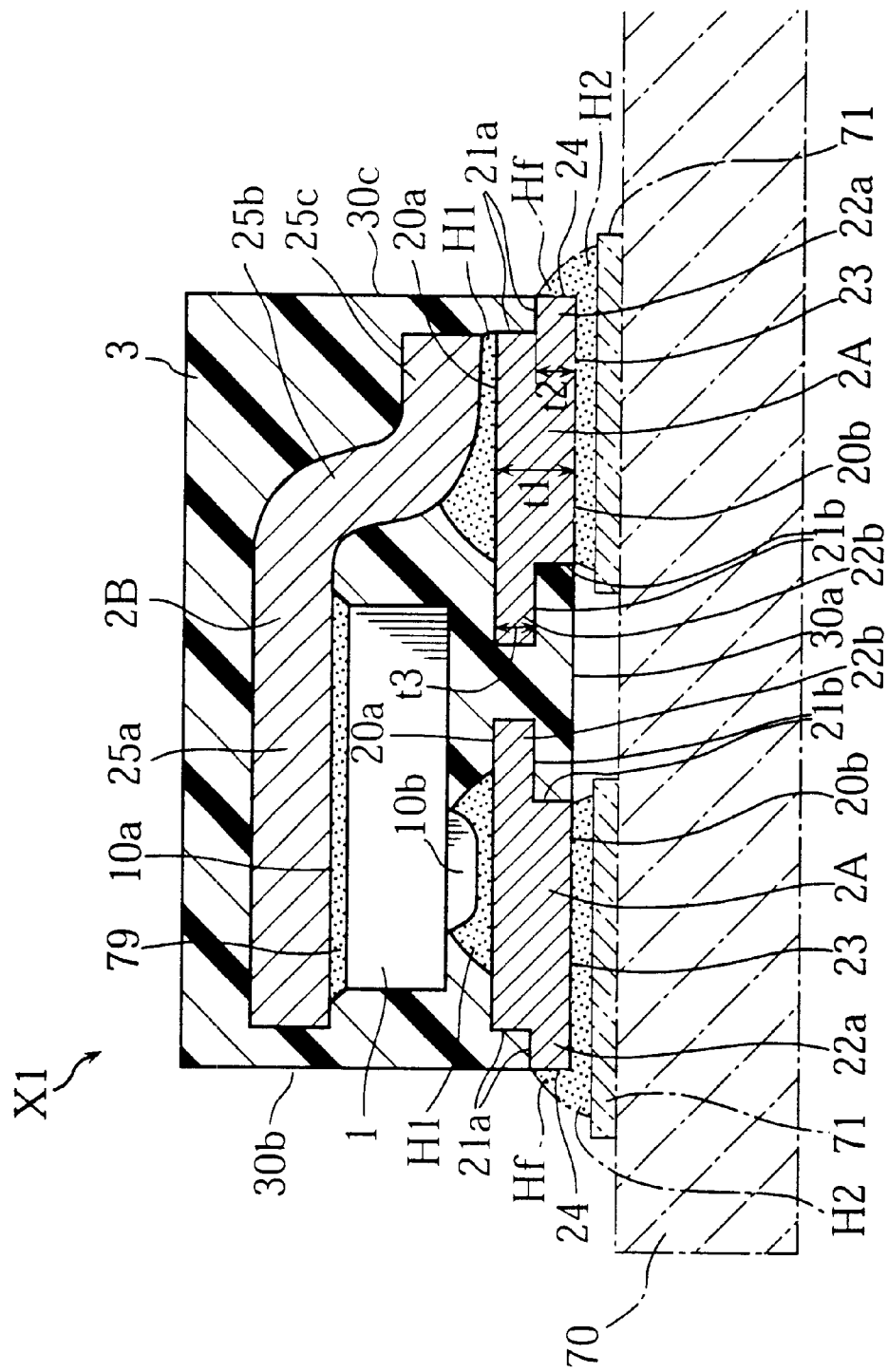
FIG. 2 is a sectional view of the semiconductor device taken along lines II—II of FIG. 1.
Figure 3:
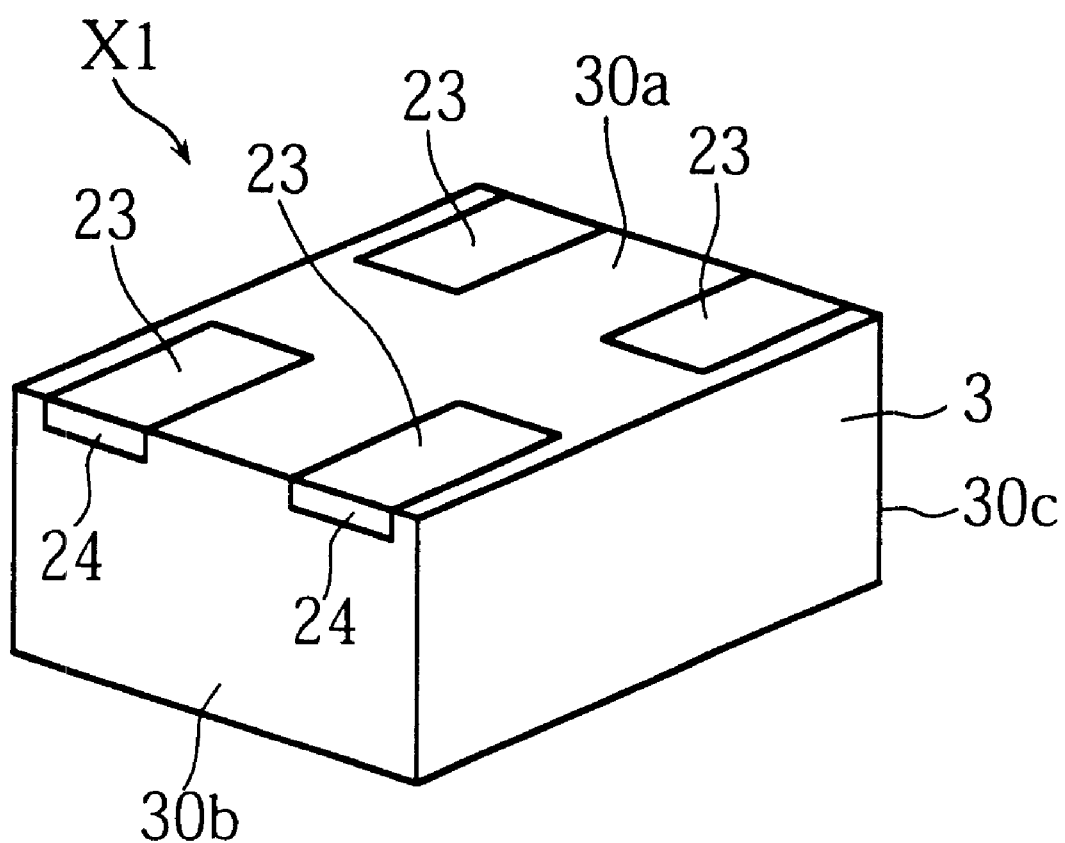
FIG. 3 is a perspective view of the semiconductor device of FIG. 1 as viewed from the opposite side of FIG. 1.

FIGS. 1–3 illustrate a semiconductor device X1 according to the present invention. As clearly shown in FIGS. 1 and 2, the semiconductor device X1 comprises a semiconductor chip 1, four first conductors 2A, a second conductor 2B and a resin package 3. In FIG. 1, the resin package 3 is illustrated as transparent.

The resin package 3, which is provided for sealing the semiconductor chip 1 and the conductors 2A and 2B, may be a rectangular parallelepiped for example. The resin package 3 may be formed of an epoxy resin for example.

The first and the second conductors 2A, 2B are made of a metal such as copper and obtained from a conductor frame F, which will be described later. The four first conductors 2A, each of which is in the form of a rectangular plate or chip, are arranged as spaced from each other. Each of the first conductors 2A has an upper surface 20a formed with a retreated portion 21a defining a stepped portion at one end thereof and a lower surface 20b formed with a retreated portion 21b defining a stepped portion at the other end thereof. Thus, the first conductor 2A is provided, at the opposite ends thereof, with thin-walled portions 22a, 22b respectively having a thickness t2 or t3 which is about half the thickness of the intermediate portion. The upper surface 20a and the lower surface 20b of the first conductor 2A serve as the first surface and the second surface of the present invention, respectively.

The lower surface 20b of each first conductor 2A at a portion other than the retreated portion 21b is substantially flush with a bottom surface 30a of the resin package 3 and is exposed to the outside at the bottom surface 30a. As clearly shown in FIG. 3, the exposed portions are rectangular and serve as terminals 23 for surface-mounting. The thin-walled portion 22a of the first conductor 2A has a side surface 24 which is substantially flush with a corresponding one of opposite side surfaces 30b, 30c of the resin package 3 and is exposed to the outside at the side surface 30b or 30c. The side surface 24 is connected to the terminal 23 so as to rise from one edge of the terminal 23.

The semiconductor chip 1 has opposite surfaces provided with an electrode 10a and a pair of electrodes 10b, respectively. The paired electrodes 10b of the semiconductor chip 1 are arranged to face the upper surfaces 20a of the two first conductors 2A, respectively, for electrical connection thereto via solder deposits H1.

The second conductor 2B includes a main portion 25a, and an auxiliary portion 25c connected to the main portion 25a via a bent intermediate portion 25b. The main portion 25a is bonded to the upper surface of the semiconductor chip 1 via a conductive adhesive 79 or solder, thereby electrically connecting the second conductor 2B and the electrode 10a of the semiconductor chip 1. The auxiliary portion 25c is bonded to the upper surfaces 20a of two first conductors 2A via solder deposits H1.

Next, a method for making the semiconductor device X1 will be described with reference to FIGS. 4–10.

Figure 4:
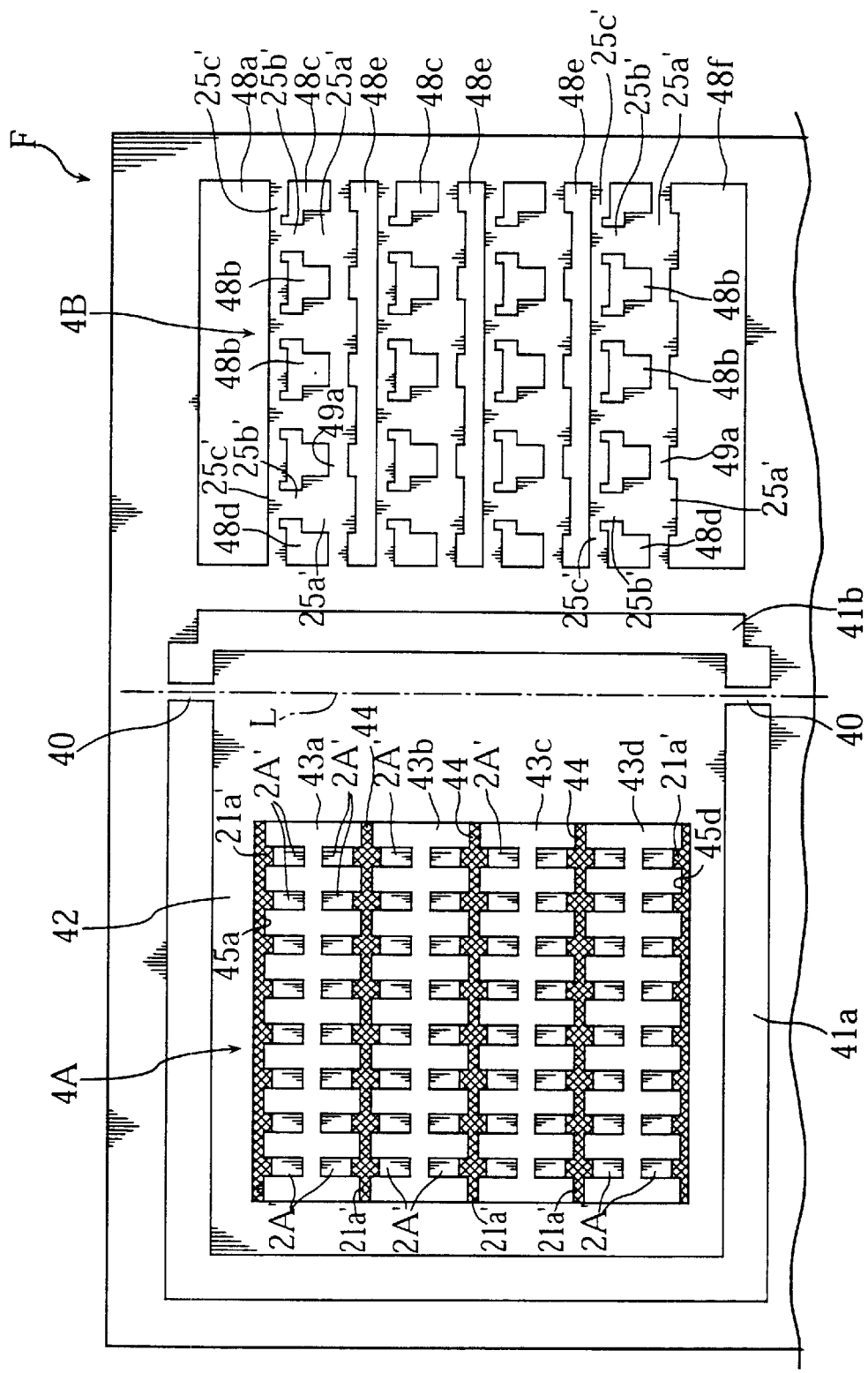
FIG. 4 is a plan view of a conductor frame used for making the semiconductor device of FIG. 1.
Figure 5:
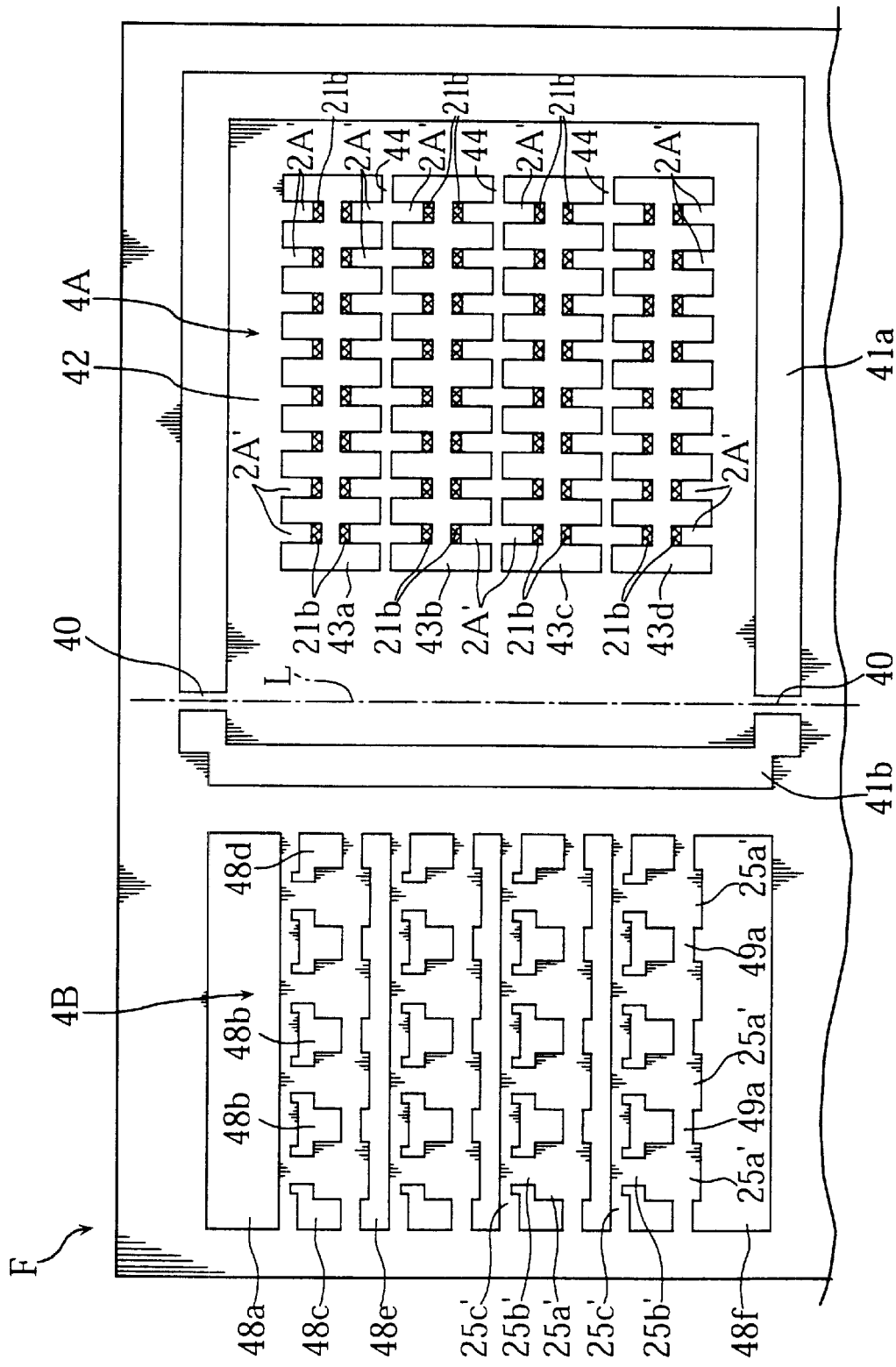
FIG. 5 is a plan view of the conductor frame of FIG. 4 as viewed from the opposite side of FIG. 4.

First, a conductor frame F having a structure as shown in FIGS. 4 and 5 is prepared. The frame F is formed by punching and etching a copper plate of a predetermined thickness. In FIGS. 4 and 5, the portions which are made thinner than other portions by the etching process (half etching process) are indicated by crisscross hatching.

In the conductor frame F, first regions 4A for providing the first conductors 2A of the semiconductor device X1 and second regions 4B for providing the second conductors 2B are aligned widthwise (transversely in FIGS. 4 and 5) of the conductor frame F. The conductor frame F is elongated vertically in the figures, and the plurality of first regions 4A are arranged longitudinally of the conductor frame F as regularly spaced from each other so are the plurality of second regions 4B. Each of the first regions 4A is arranged in a generally rectangular movable portion 42 which is circumferentially surrounded by slits 41a and 41b except for the portion provided with a pair of support bars 40. As will be described later, the movable portion 42 is pivotable about a center line L connecting the pair of support bars 40 to each other to lie over the second region 4B.

The movable portion 42 of the first region 4A is formed with e.g. four openings 43a–43d of a predetermined configuration to provide a plurality of rectangular lead portions 2A' arranged like comb-teeth. Each of the plural lead portions 2A' is connected to a corresponding one of three bridge portions 44 partitioning adjacent ones of the openings 43a–43d or to a corresponding one of side edges 45a, 45d of the openings 43a, 43d. As clearly shown in FIG. 4, retreated portions 21a', which are formed by reducing the thickness of the conductor frame F by half etching the obverse surface of the frame F, exist at the base ends of the lead portion 2A', at the bridge portions 44 connected to the base ends and at side edges 45a, 45d. As clearly shown in FIG. 5, retreated portions 21b are provided at the respective tip ends of the lead portion 2A' on the reverse surface of the conductor frame F.

The conductor frame F is formed with plural kinds of openings 48a–48f in the second region 4B, thereby providing portions 25a' corresponding to the main portions 25a of the second conductors 2B, portions 25b' corresponding to the intermediate portions 25b, and portions 25c' corresponding to the auxiliary portions 25c, which are arranged in plural rows and columns. The portions 25c, spaced widthwise of the conductor frame F are connected to each other. The portions 25a' are also connected to each other via the bridge portions 49a. This arrangement prevents the portions which later become the second conductors 2B from unexpectedly separating from the conductor frame F.

Figure 6:
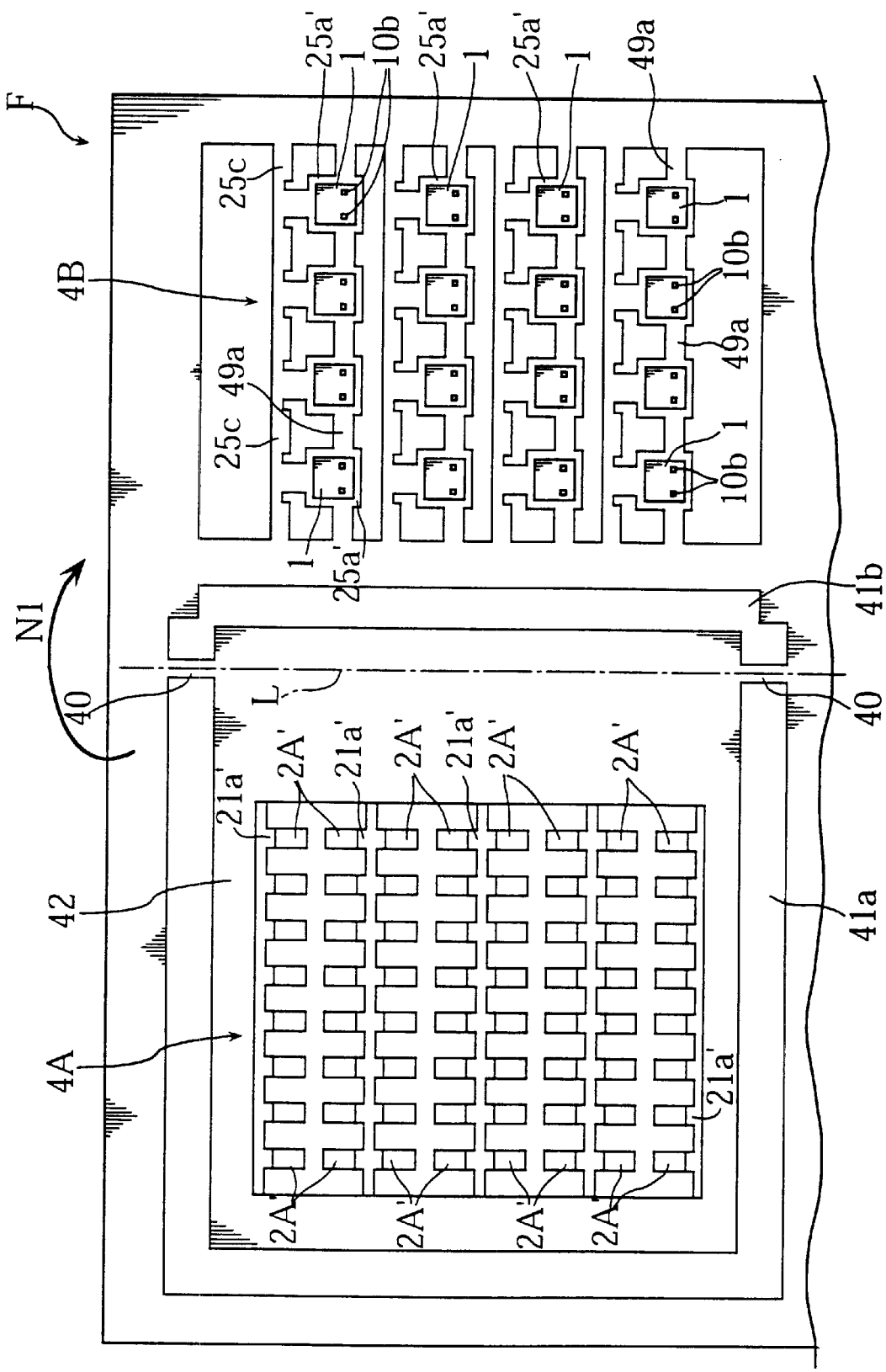
FIG. 6 illustrates a semiconductor chip mounting step in manufacturing the semiconductor device of FIG. 1.

As shown in FIG. 6, after the above-described frame F is prepared, a semiconductor chip 1 is mounted for bonding to each of the portions 25a' in the second region 4B. Before or after this process step, solder paste (not shown) is applied to the lead portions 2A' at locations which will be later soldered to the electrodes 10b of the semiconductor chip 1 or to the portions 25c' of the second region 4B. Although each two adjacent portions 25a' are illustrated as connected to each other via the bridge portion 49a in FIG. 6, the bridge portion 49a is removed by cutting before or after the bonding of the semiconductor chips 1.

Figure 7:
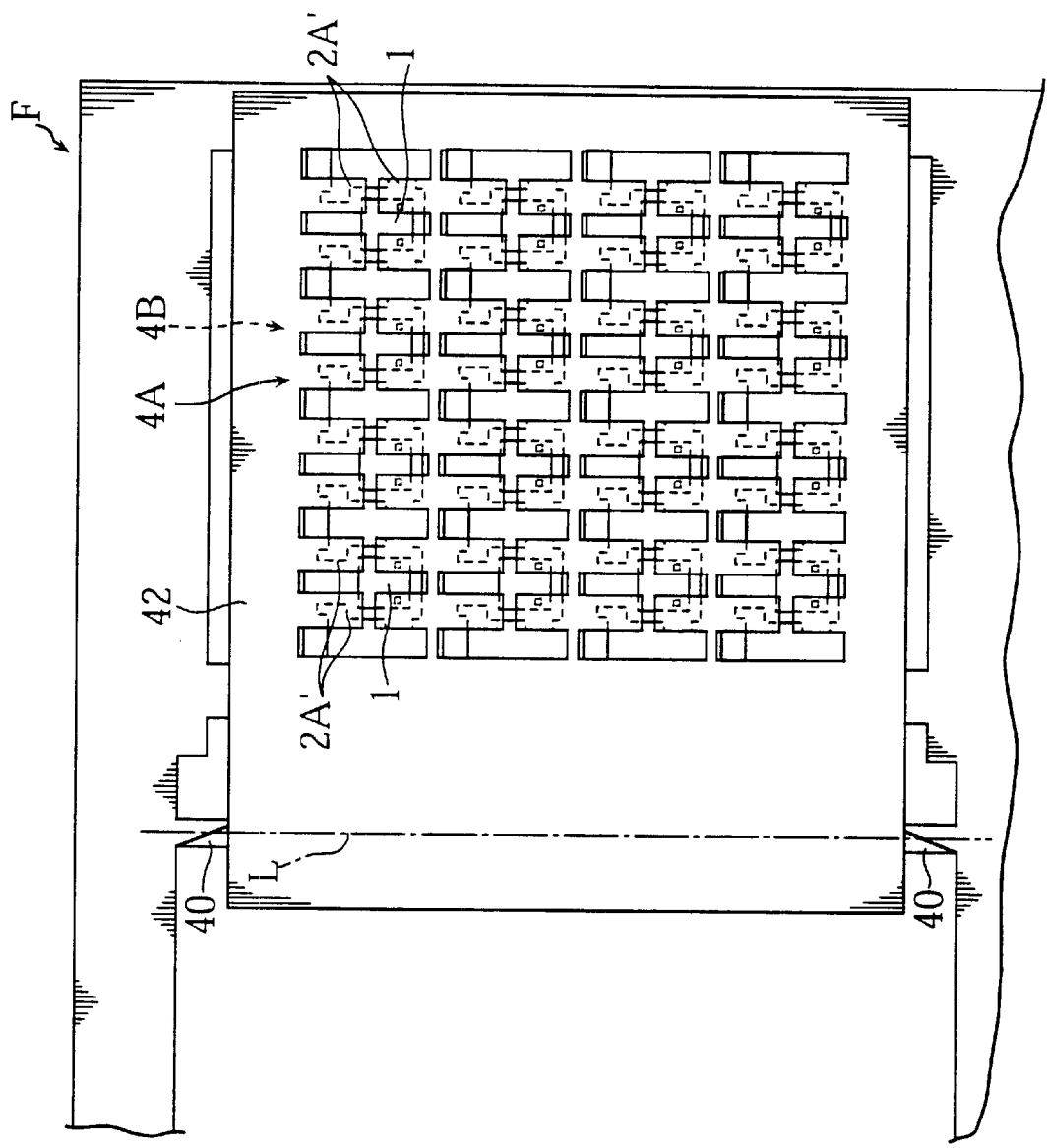
FIG. 7 illustrates a step for pivoting the movable portion in manufacturing the semiconductor device of FIG. 1.
Figure 8:
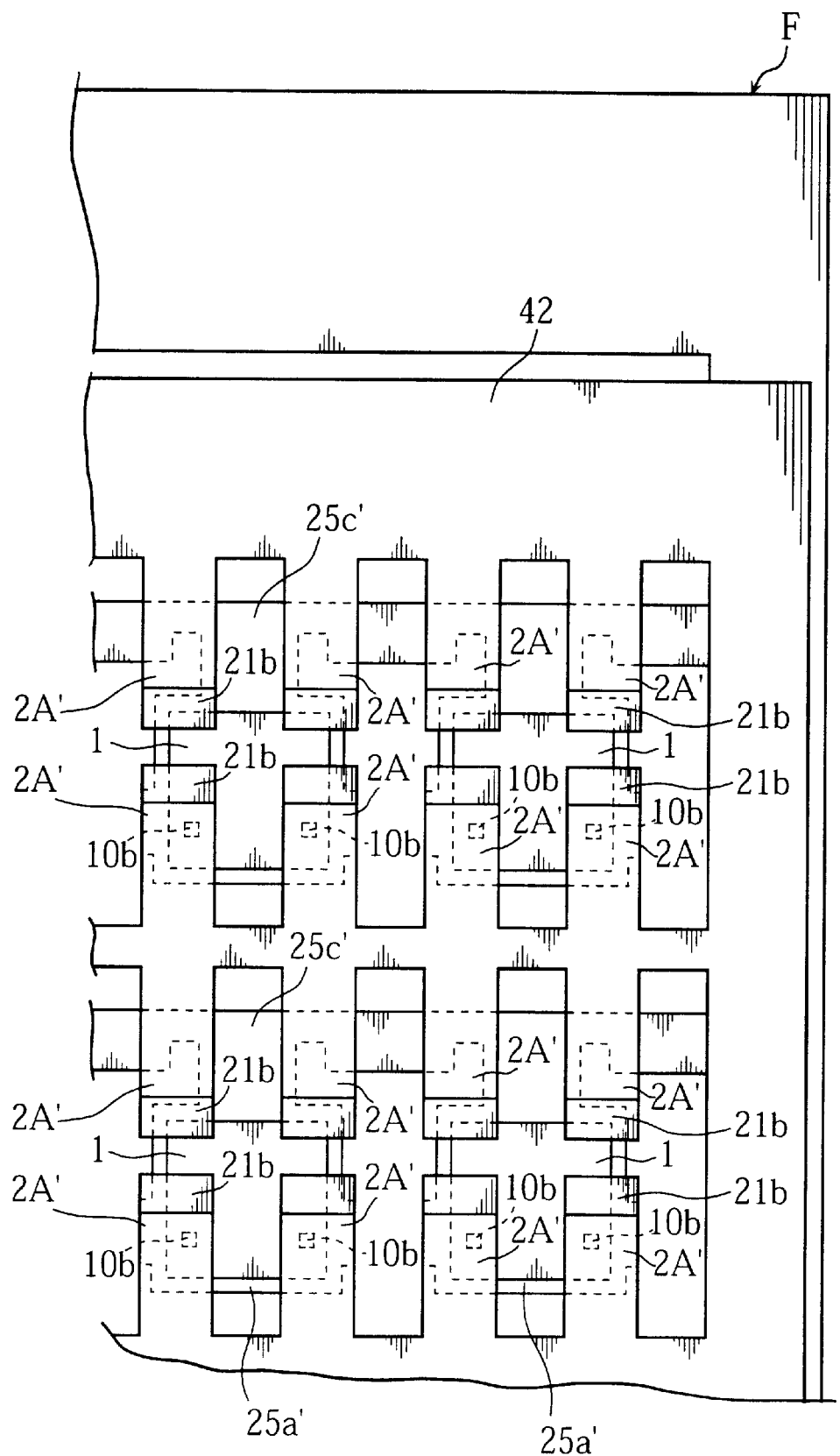
FIG. 8 is an enlarged view illustrating a principal portion of FIG. 7.

Subsequently, the movable portion 42 is pivoted about the center line L in the arrow N1 direction, thereby laminating the first region 4A over the second region 4B, as shown in FIG. 7. In this lamination step, as clearly shown in FIG. 8, the paired electrodes 10b of each semiconductor chip 1 are brought into facing relationship to two lead portions 2A', respectively, whereas each portion 25c' of the second region 4B is brought into facing relationship to other two lead portions 2A'. After the lamination, the solder paste is heated for reflow soldering, thereby bonding the mutually facing portions to each other.

Figure 9:
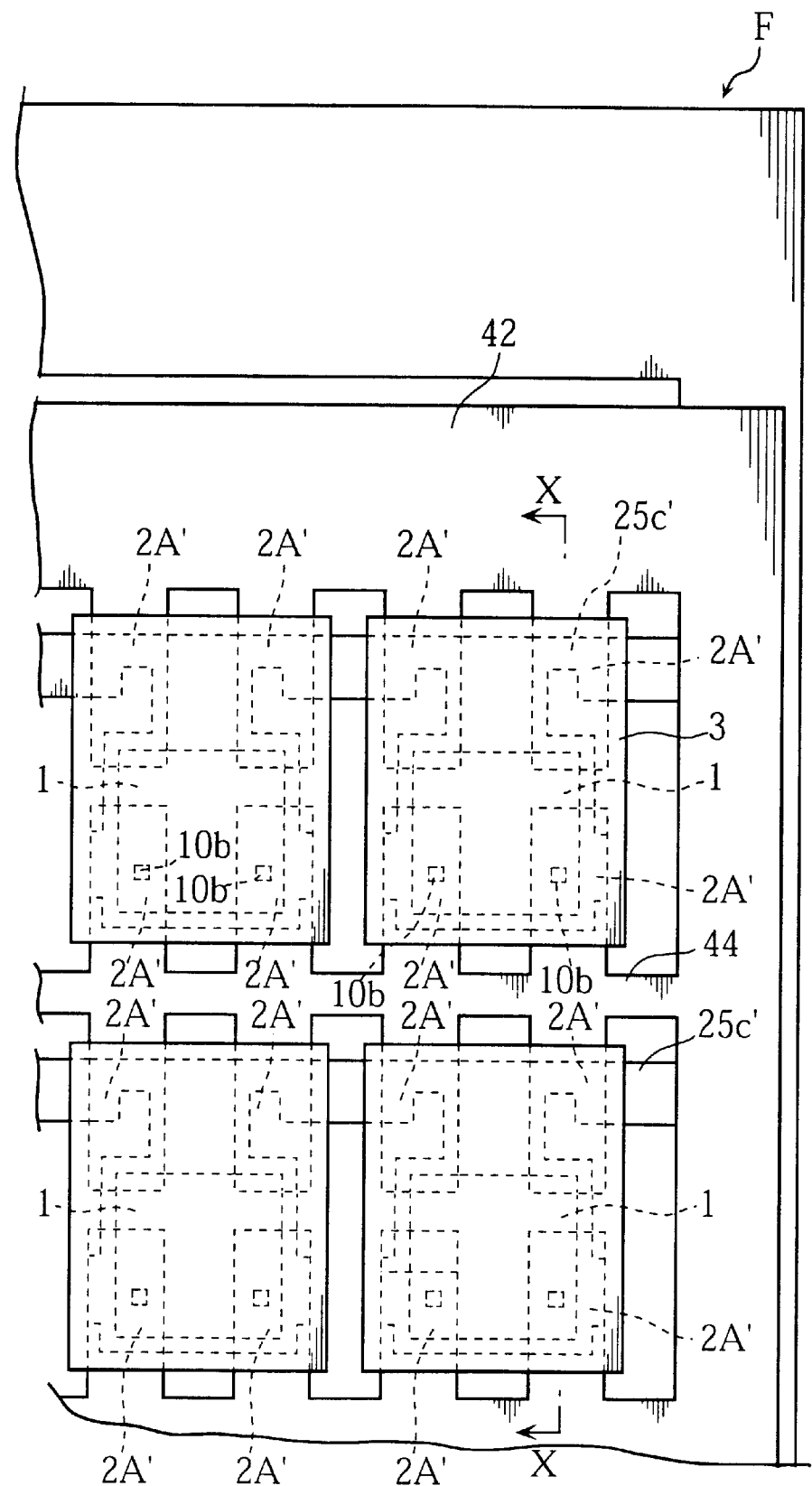
FIG. 9 illustrates a resin packaging process in manufacturing the semiconductor device of FIG. 1.
Figure 10:
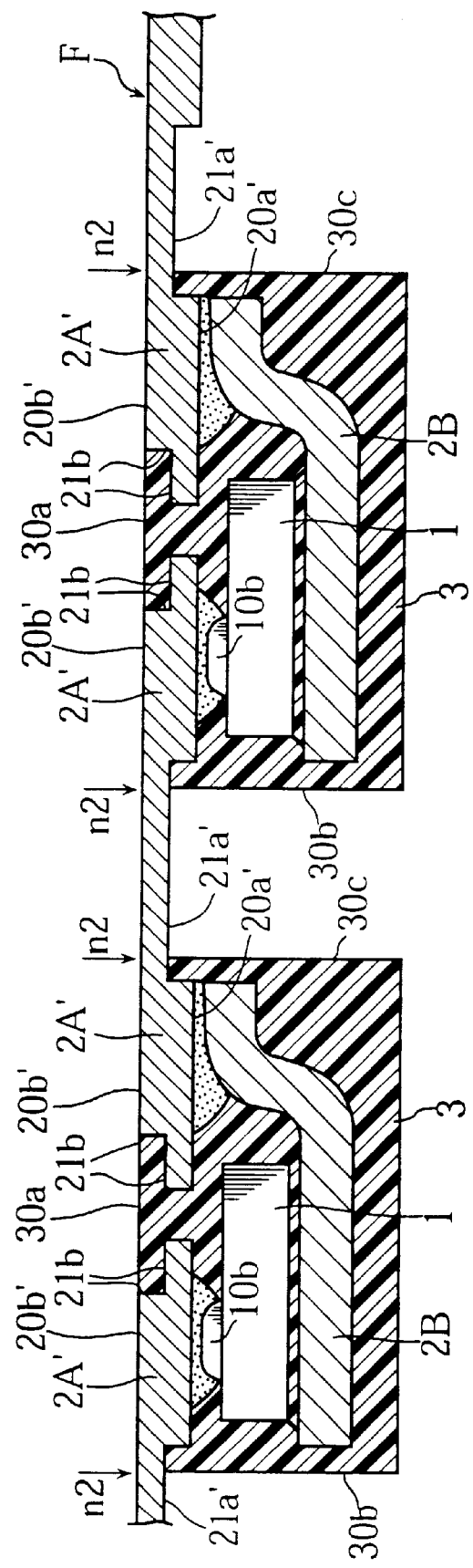
FIG. 10 is a sectional view taken along lines X—X of FIG. 9.

Thereafter, as shown in FIG. 9, resin packages 3 each for collectively sealing one semiconductor chip 1 and four lead portions 2A' are formed by transfer molding for example. In this step, the resin package 3 is so formed that each lead portion 2A' is not entirely sealed in the resin package 3 for causing the base end of the lead portion 2A' to project outward from the resin package 3. Further, as clearly shown in FIG. 10, in forming the resin packages 3, the bottom surface 30a (oriented upward in this figure) of each resin package 3 is made flush with the surface 20b' of the lead portion 2A' at locations which are not provided with the retreated portion 21.

After the resin packages 3 are formed, cutting is performed with respect to the lead portions 2A'. In this cutting step, the lead portions 2A' are cut at positions n2 of FIG. 10 to provide cut surfaces which are flush with a corresponding one of the opposite side surfaces 30b, 30c of the resin package 3. As a result of the cutting, part of each lead portion 2A' becomes the first conductor 2A of the semiconductor device X1 shown in FIGS. 1–3. Further, each portion 25c' of the second region 4B is also cut at portions projecting outward from the other side surfaces of the resin package 3 in FIG. 9. By this cutting step, the resin packages 3 are separated from the conductor frame F, so that a plurality of semiconductor devices X1 are efficiently provided.

In the above-described fabrication method, since each of the lead portions 2A' is cut at the thin-walled portion provided with the retreated portion 21a', the cutting operation can be facilitated. Preferably, each portion 25c' of the conductor frame F may also be made thin at the portion projecting outward from the other side surfaces of the resin package 3 for facilitating the cutting at that portion. The thin-walled portion of each lead portion 2A' provided at the portion to be cut is located not on the side of the lower surface 20b' but on the side of the upper surface 20a'. Therefore, the side surface 24 provided by cutting the lead portion 2A' can be connected to the terminal 23 on the lower surface 20b'. In this way, the above-described fabrication method provides a semiconductor device X1 wherein plural terminals 23 are exposed at the bottom surface 30a of the resin package 3 and the cutting surfaces of the first conductors 2A (i.e. the side surfaces 24) are exposed at the side surface 30b or 30b of the resin package 3 as connected to the corresponding terminal 23.

In use, the semiconductor device X1 provides the following advantages. By using solder H2, the semiconductor device X1 is surface-mounted to a plurality of terminals 71 of a mother board indicated by phantom lines in FIG. 2. At this time, the solder H2 does not entirely remain between the terminal 71 and the terminal 23 but partially adheres to the side surface 24 of the first conductor 2A, forming a solder fillet Hf located outside of the semiconductor device X1. This is because, the side surface 24, as a metal surface to which the solder H2 melted by heating is likely to adhere, is connected to the terminal 23 in a rising manner. Thus, in a test for determining whether the solder bonding of the semiconductor device X1 relative to the mother board is duly performed, the solder fillet Hf thus formed can be observed from the outside. Since the solder fillet Hf can be visually checked, the test can be easily performed.

In this way, according to the semiconductor device X1 of this embodiment, it is possible to facilitate the cutting operation of each lead 2A' in the fabrication process and to facilitate the test for checking the soldered state when the semiconductor device X1 is surface-mounted to a predetermined position. Moreover, in the semiconductor device X1, the lower surface 20b of the first conductor 2A is also provided with a retreated portion 21b. By the provision of the retreated portion 21b, the terminal 23 can be designed to have a desirable area and configuration. Since the retreated portion 21b does not decrease the area of the upper surface 20a of the first conductor 2A, the upper surface 20a can have an area sufficient for solder-bonding the electrode 10b or the predetermined portion of the second conductor 2B. Further, in the semiconductor device X1, wires such as gold wires are not used for providing electrical connection between the components. Thus, no wire bonding is necessary for making the semiconductor device, which facilitates the manufacturing of the device and decreases the manufacturing cost.

Figure 11:
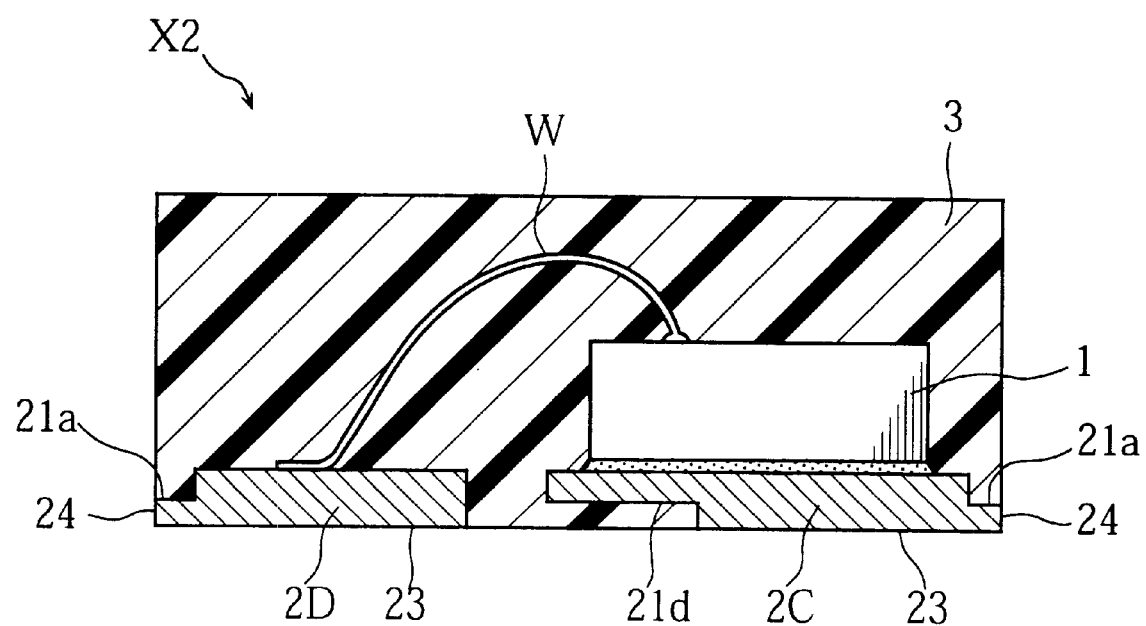
FIG. 11 is a sectional view of a semiconductor device according to a second embodiment of the present invention.
Figure 12:
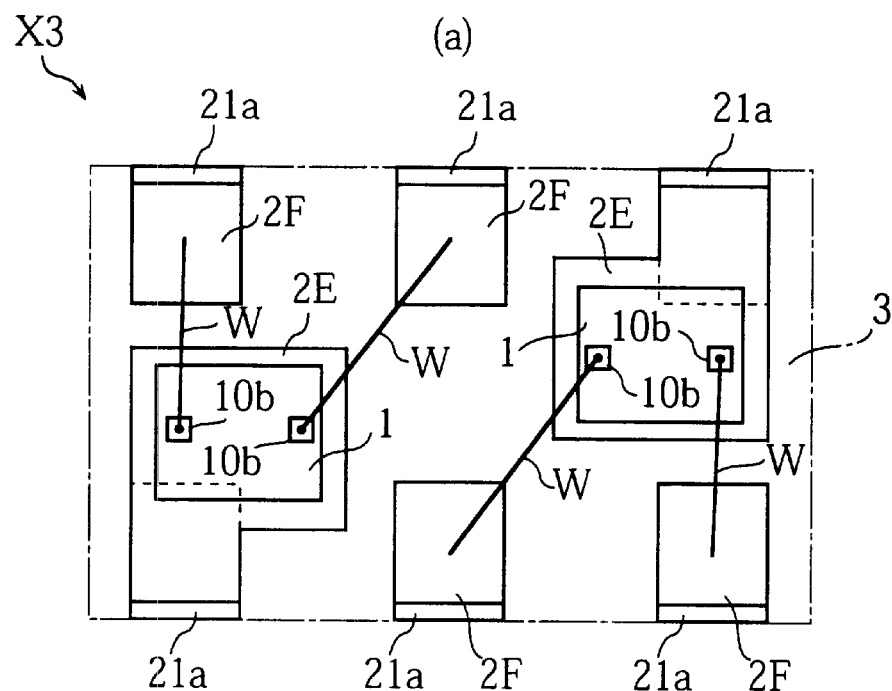
FIG. 12 is a plan view showing a semiconductor device according to a third embodiment of the present invention in which the resin package is illustrated as transparent.
Figure 13:
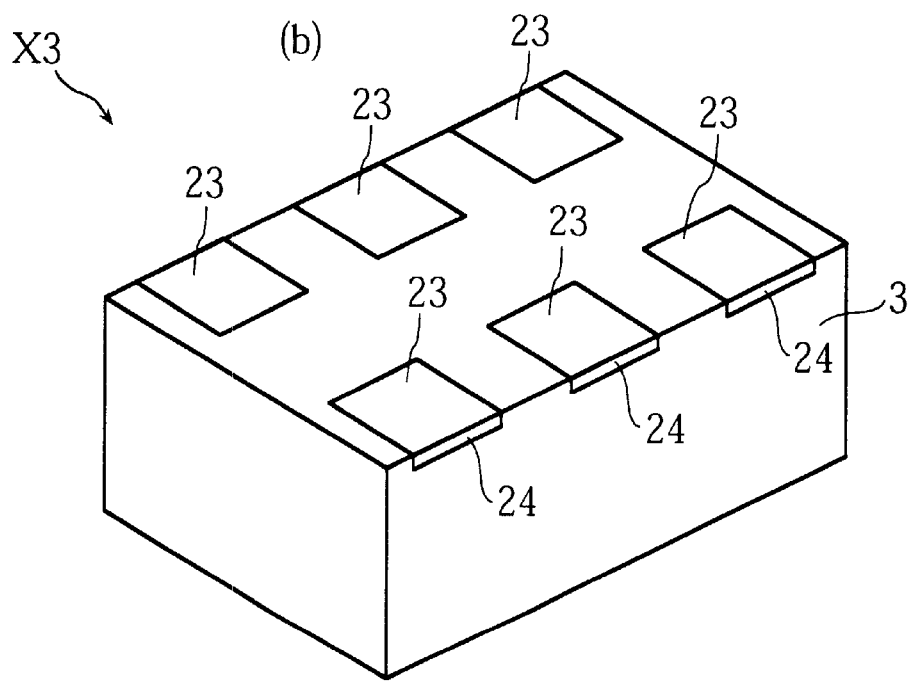
FIG. 13 is a perspective view of the semiconductor device of FIG. 12 as viewed from the opposite side of FIG. 12.
Figure 14A:
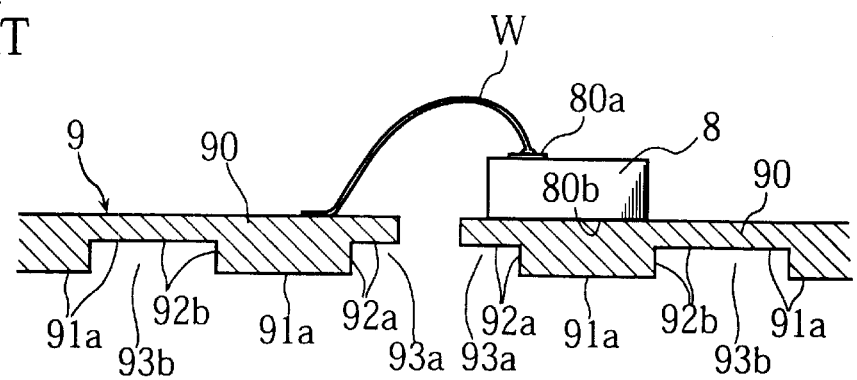
FIGS. 14A–14C are sectional views illustrating process steps of a prior art method for making a semiconductor device
Figure 14B:
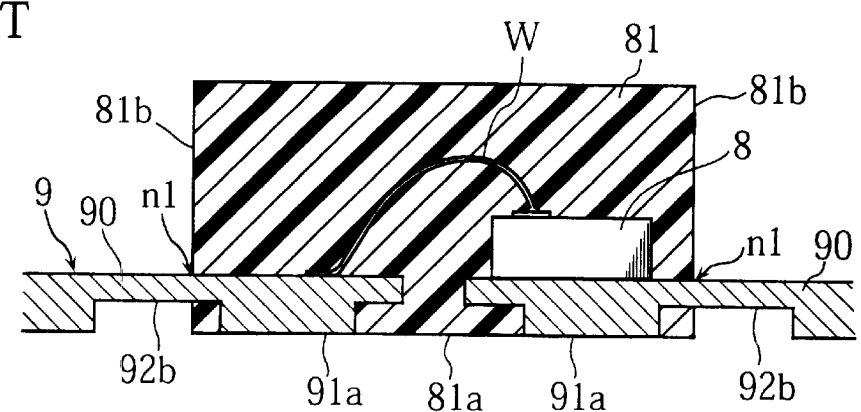
Figure 14C:
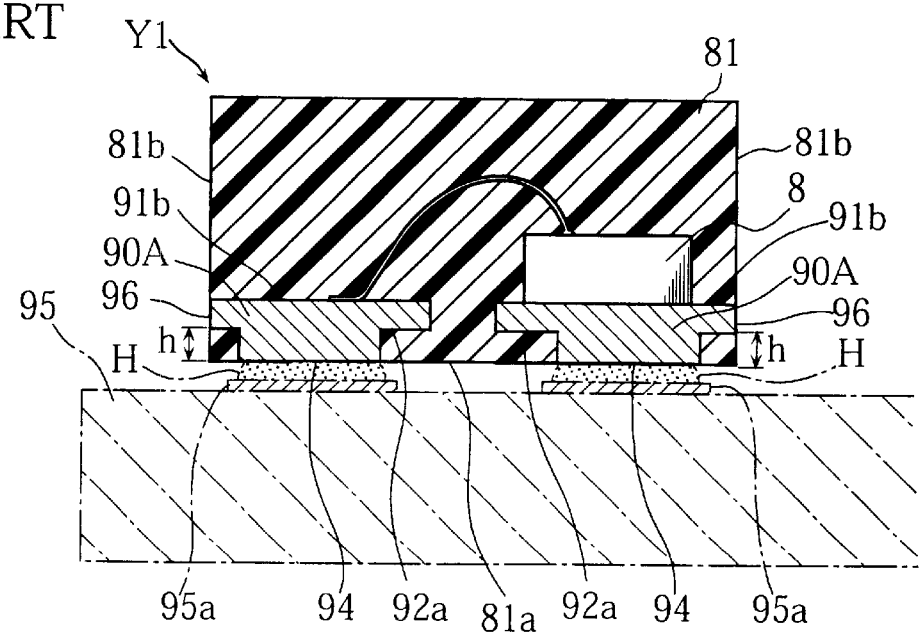
Figure 15:
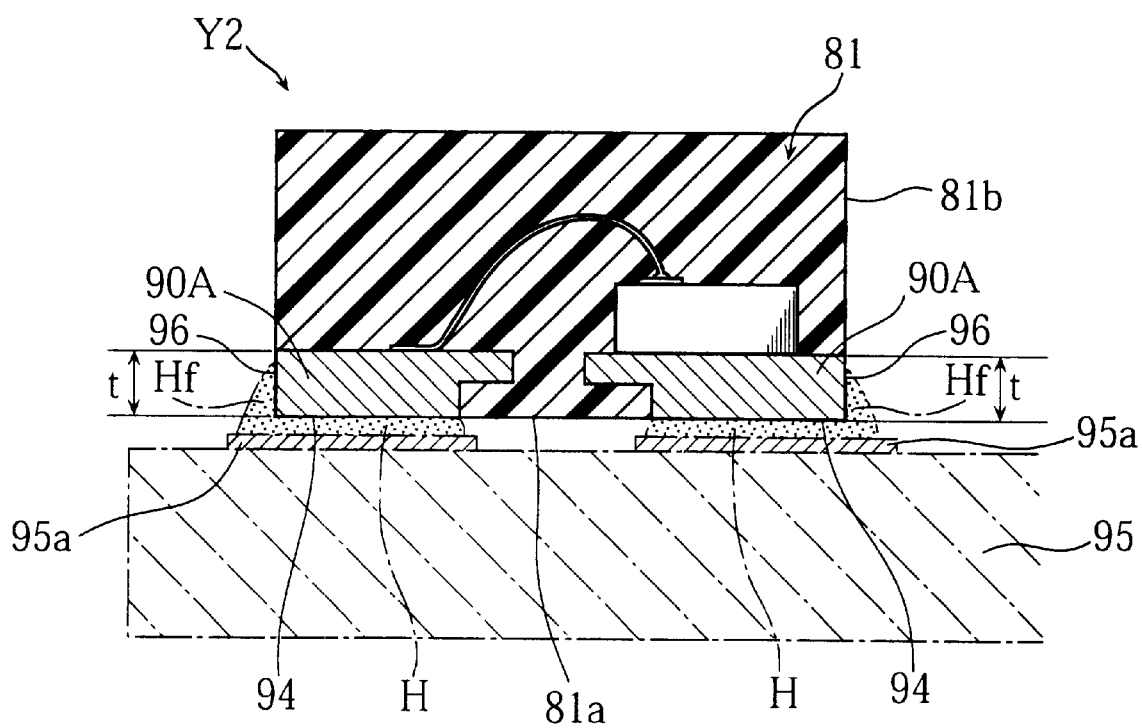
FIG. 15 is a sectional view showing another prior art semiconductor device.

FIGS. 11, 12 and 13 illustrate semiconductor devices according to other embodiments of the present invention. In these figures, the elements which are identical or similar to those of the first embodiment are designated by the same reference signs as those used for the first embodiment.

In the semiconductor device X2 shown in FIG. 11, a semiconductor chip 1 is mounted to a conductor 2C, and an electrode (not shown) provided on the upper surface of the semiconductor chip 1 is electrically connected to a conductor 2D via a wire W. In this way, according to the present invention, a wire may be utilized for providing electrical connection between the components. In the semiconductor device X2, the lower surface of the conductor 2C is provided with a retreated portion 21d, whereas the lower surface of the conductor 2D is not provided with a retreated portion. The provision of a retreated portion at the lower surface side of a conductor makes the area of a terminal 23 exposed at the bottom surface of the resin package 3 smaller than the upper surface area of the conductor. Therefore, in the case where the entire lower surface of a conductor is to be utilized as a terminal 23 because of its originally small area, a retreated portion need not be provided at the lower surface of the conductor.

The semiconductor device X3 illustrated in FIGS. 12 and 13 includes two semiconductor chips 1, two conductors 2E each for mounting a respective one of the semiconductor chips 1, four conductors 2F electrically connected to the electrodes of the semiconductor chips 1 via wires W, and a resin package 3 for sealing these components. As shown in FIG. 13, the semiconductor device X3 has a bottom surface provided with six terminals 23. In this way, a semiconductor device according to the present invention may include a plurality of semiconductor chips, and accordingly, the number of conductors is not limitative but may be increased or decreased appropriately. Further, the kind or function of a semiconductor chip is not limitative and various kinds of semiconductor chips may be utilized.

The present invention is not limited to the above-described embodiments. According to the present invention, the specific structure of each component of the semiconductor device may be modified in various ways. Similarly, details of each process step of a semiconductor device fabrication method may be modified in various ways according to the present invention.

For example, in the case where a side surface of a conductor is exposed at a side surface of the resin package, the side surface may not necessarily be flush with the side surface of the resin package. According to the present invention, an end of the conductor may project from the side surface of the resin package. Moreover, the thickness of the thin-walled portion provided at the conductor is not limitative.

What is claimed is:

1. A semiconductor device comprising:
    a plurality of conductors, each of which includes a first surface, a second surface opposite to the first surface, a thickness defined between the surfaces, and an outer thin-walled end portion retreating from the first surface toward the second surface and having a side surface connected to the second surface;
    a semiconductor chip having a plurality of electrodes electrically connected to the plurality of conductors, respectively; and
    a resin package for sealing the conductors and the semiconductor chip while exposing, for each conductor, the side surface of the outer thin-walled end portion and at least a part of the second surface connected to the side surface, the resin package having a bottom surface for surface mounting;
    wherein the outer thin-walled end portion of each conductor provides a part of the second surface which is substantially flush with the bottom surface of the resin package; and
    wherein at least one of the conductors includes an inner thin-walled end portion retreating from the second surface toward the first surface to be spaced from the bottom surface of the resin package.

2. A method of making a semiconductor device comprising the steps of:
    preparing a conductor frame including a plurality of lead portions, each of the lead portions including a first surface, a second surface opposite to the first surface, and a thickness defined between the surfaces;
    half-etching both of the first and second surfaces of the lead portions so that each of the lead portions includes a first thin-walled portion retreating from the first surface toward the second surface while at least one of the lead portions has a second thin-walled portion retreating from the second surface toward the first surface;
    mounting a semiconductor chip including a plurality of electrodes onto the conductor frame with the second surface of the lead portions facing the semiconductor chip;
    electrically connecting the plurality of electrodes to the plurality of lead portions, respectively;
    forming a resin package for sealing the lead portions and the semiconductor chip while exposing the second surface of each lead portion so that the first thin-walled portion projects outward; and
    cutting the first thin-walled portion projecting from the resin package outside the resin package.

3. The method for making a semiconductor device according to claim 2, wherein the resin package is formed so that the first thin-walled portion of each lead portion extends from inside to outside the resin package.

* * * * *